(12) United States Patent
Kolobov et al.

(10) Patent No.: US 12,113,145 B2
(45) Date of Patent: *Oct. 8, 2024

(54) AVALANCHE PHOTODETECTOR (VARIANTS) AND METHOD FOR MANUFACTURING THE SAME (VARIANTS)

(71) Applicant: DEPHAN LLC, Moscow (RU)

(72) Inventors: Nikolai Afanasevich Kolobov, Moscow (RU); Konstantin Yurevich Sitarskiy, Moscow (RU); Vitalii Emmanuilovich Shubin, Moscow (RU); Dmitrii Alekseevich Shushakov, Moscow (RU); Sergei Vitalevich Bogdanov, Moscow (RU)

(73) Assignee: DEPHAN LLC, Moscow (RU)

( * ) Notice: Subject to any disclaimer, the term of this patent is extended or adjusted under 35 U.S.C. 154(b) by 402 days.

This patent is subject to a terminal disclaimer.

(21) Appl. No.: 17/427,143

(22) PCT Filed: Mar. 4, 2020

(86) PCT No.: PCT/RU2020/050036
§ 371 (c)(1),
(2) Date: Jul. 30, 2021

(87) PCT Pub. No.: WO2020/185123
PCT Pub. Date: Sep. 17, 2020

(65) Prior Publication Data
US 2022/0102571 A1 Mar. 31, 2022

(30) Foreign Application Priority Data
Mar. 12, 2019 (RU) .......................... RU2019106805

(51) Int. Cl.
*H01L 31/107* (2006.01)
*H01L 31/0224* (2006.01)
*H01L 31/18* (2006.01)

(52) U.S. Cl.
CPC .... *H01L 31/107* (2013.01); *H01L 31/022466* (2013.01); *H01L 31/1804* (2013.01)

(58) Field of Classification Search
CPC ........... H01L 31/107; H01L 31/022466; H01L 31/1804; H01L 27/1443; H01L 31/02366; H01L 31/1884
See application file for complete search history.

(56) References Cited

U.S. PATENT DOCUMENTS 6,027,956 A * 2/2000 Irissou ............ H01L 31/035281
257/458
7,829,915 B2 11/2010 Shi et al.
(Continued)

FOREIGN PATENT DOCUMENTS

CN 108231947 A * 6/2018 ......... H01L 27/1443
CN 108511467 A * 9/2018 ......... H01L 27/1443
(Continued)

OTHER PUBLICATIONS

Search Report in PCT/RU2020/050036 dated Sep. 8, 2020.

*Primary Examiner* — Mohammed Shamsuzzaman
(74) *Attorney, Agent, or Firm* — Bardmesser Law Group (57) ABSTRACT

An avalanche photodetector (APD) is proposed, wherein a photoconverter and at least one avalanche amplifier are located on the same wafer, its multiplication layer covers the entire surface of the conductive wafer, and its contact layer is formed in some region of the multiplication layer. Outside the contact layer, the multiplication layer functions as a photoconverter, thus facilitating the photocarriers getting into the avalanche amplifier. A dielectric-filled circular groove surrounding the avalanche amplifier suppresses photoelectric communication noises generated by neighboring (Continued)

avalanche amplifiers, thus allowing to manufacture multi-channel avalanche instruments with higher threshold sensitivity.

15 Claims, 6 Drawing Sheets

(56) References Cited

U.S. PATENT DOCUMENTS

| | | | | |
|---|---|---|---|---|
| 8,039,918 | B2* | 10/2011 | Nakata | H01L 31/1075 |
| | | | | 257/466 |
| 9,035,410 | B2 | 5/2015 | Yuan et al. | |
| 9,570,647 | B2 | 2/2017 | Yuan et al. | |
| 10,340,407 | B2* | 7/2019 | Shubin | H01L 31/022466 |
| 10,446,700 | B2* | 10/2019 | Wang | H01L 31/1808 |
| 11,322,636 | B2* | 5/2022 | Chowdhury | H01L 31/107 |
| 11,749,774 | B2* | 9/2023 | Kolobov | H01L 31/107 |
| | | | | 257/186 |
| 2013/0009265 | A1* | 1/2013 | Dautet | H01L 31/107 |
| | | | | 257/E31.124 |
| 2014/0042581 | A1* | 2/2014 | Mheen | H01L 31/02002 |
| | | | | 257/438 |
| 2017/0194522 | A1* | 7/2017 | Wang | H01L 31/02327 |
| 2017/0229598 | A1* | 8/2017 | Roehrer | H01L 31/035272 |
| 2019/0019899 | A1* | 1/2019 | Wang | H01L 31/02 |
| 2021/0151613 | A1* | 5/2021 | Yang | H01L 31/028 |

FOREIGN PATENT DOCUMENTS

| | | | | | |
|---|---|---|---|---|---|
| CN | 108573989 | A | * | 9/2018 | H01L 27/14623 |
| CN | 109728132 | A | * | 5/2019 | H01L 27/1443 |
| WO | WO-2019189700 | A1 | * | 10/2019 | H01L 27/14603 |
| WO | WO-2020119200 | A1 | * | 6/2020 | H01L 27/1443 |

* cited by examiner

AVALANCHE PHOTODETECTOR (VARIANTS) AND METHOD FOR MANUFACTURING THE SAME (VARIANTS)

CROSS REFERENCE TO RELATED APPLICATIONS

This application is a US National Phase of PCT/RU2020/050036, filed on Mar. 4, 2020, which claims priority to Russian Patent Application No. 2019106805, filed on Mar. 12, 2019.

TECHNICAL FIELD

The claimed invention relates to avalanche photodetectors (APD), which are fast and highly sensitive instruments, widely used in LiDARs, communications systems, machine vision, robotics, medicine, biology, environmental monitoring, etc.

BACKGROUND OF THE RELATED ART

A conventional avalanche photodetector (APD) comprises a number of semiconductor layers put onto a semiconductor wafer.

A group of semiconductor layers forms a photoconverter, in which signal photons are absorbed, generating free charge carriers, i.e., electrons and electron holes. These light-generated charge carriers then get into another group of semiconductor layers, i.e., an avalanche amplifier, inside which an area is formed where the intensity of electric field is sufficient for avalanche multiplication of the charge carriers.

Threshold sensitivity is the basic parameter of an APD and depends on the properties of both the photoconverter and the avalanche amplifier.

Threshold sensitivity is largely limited by the dark current of the avalanche amplifier, which is mainly caused by the highly intense field that is required for avalanche multiplication of photocarriers.

In order to reduce the dark current of the avalanche amplifier and, therefore, increase the APD's threshold sensitivity, the area occupied by the avalanche amplifier can be made smaller in relation to the area occupied by the photoconverter.

Examples of this can be seen, e.g. in avalanche photodetectors according to patents U.S. Pat. No. 9,035,410 and RU 2,641,620, in which the avalanche amplifier that comprises two layers—a contact layer and a multiplication layer—and the photoconverter are both located on the same wafer, wherein the area of the photoconverter is greater than that of the amplifier.

In the APD according to the patent RU 2,641,620, the multiplication layer is made of a semiconductor material with the same conductivity type as the signal photoconverter, faces the wafer and directly adjoins the autonomous photoconverter, which allows to reduce excessive dark noises caused by photocarriers being transmitted from the photoconverter to the avalanche amplifier over an external electrical circuit (see U.S. Pat. No. 9,035,410).

DRAWBACKS OF THE RELATED ART

The main drawback is that making the multiplication layer independent of the photoconverter hinders photocarriers generated in the photoconverter layer from getting to the multiplication layer, thus causing multiplied photosignal losses. This results in deteriorated threshold sensitivity, which is a basic parameter of a photodetector.

Technical Problem

The objective of the present disclosure is to create an avalanche photodetector (APD) having a high threshold sensitivity, which will not be limited by inefficient transmission of photocarriers from the photoconverter to the avalanche amplifier. In addition, the proposed APD will have less dark current and less interference noise from adjacent avalanche amplifiers in case a plurality of avalanche amplifiers is used in the same APD.

By solving all these problems, it will be possible to improve the APD's threshold sensitivity, its basic parameter.

SUMMARY OF THE INVENTION

In one embodiment, the invention includes an avalanche photodetector (APD) and a method for manufacturing the same, which allows one to make the transmission of photocarriers from the photoconverter to the avalanche amplifier more efficient by putting the multiplication layer all over the conductive wafer. The contact layer of at least one avalanche amplifier is formed in a certain area of the multiplication layer. Thus, the multiplication layer outside the contact layer functions as a photoconverter. As a result, the photocarriers that have been initiated in the photoconverter will get into the multiplication region of the avalanche amplifier unimpeded. The first electrode and the second electrode of the avalanche photodetector are placed on the contact layer and the wafer, respectively.

In order to suppress the interference noise from adjacent avalanche amplifiers (the noise arising when parasite photoelectrons of photons from hot charge carriers in adjacent avalanche amplifiers get into the multiplication region), a circular groove is used, which is filled with a dielectric material and surrounds the contact layer of the avalanche amplifier.

In order to reduce the APD's dark current from adjacent wafer regions, a closed groove is etched on the multiplication layer surface, its depth is more than or equal to the multiplication layer thickness, but less than the total thickness of the wafer and multiplication layer combined, and a photodetector is formed inside the region bounded by the groove. The groove is filled with highly doped polycrystalline silicon of the same conductivity type as the multiplication layer.

For increased efficiency, the semiconductor wafer should be made of low-resistance materials.

It is advisable that both the wafer and multiplication layer are made of the same semiconductor material.

The multiplication layer on the wafer surface can be made using the epitaxy method, and the contact layer can be made by doping the multiplication layer with a dopant that forms a layer with the opposite conductivity.

It is also advisable that the additional groove along the perimeter of the photoconverter region has width of no more than 2 μm.

It is also possible to put a high-resistance layer between the contact layer of the avalanche amplifier and the first electrode.

Additional features and advantages of the invention will be set forth in the description that follows, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 1 is a schematic transversal section of the claimed APD according to the first embodiment that comprises a semiconductor wafer 101, a multiplication layer 102 covering the entire surface of the semiconductor wafer with the same conductivity type as the multiplication layer, a circular groove 103, which is filled with a dielectric material, a dielectric layer 104 covering the multiplication layer 102 surface, a contact layer 106, which is made through diffusion of the highly-doped polycrystalline silicon 105 with the opposite conductivity to that of the multiplication layer, wherein at least one avalanche amplifier 107 and photoconverter 108, which is outside the avalanche amplifier, are formed, a first electrode 109 made of a transparent material and located on the surfaces of both the contact layer 106 and the dielectric layer 104, and a second electrode 110, which is formed on the bottom surface of the semiconductor wafer 101.

FIG. 2 is a schematic transversal section of the claimed APD according to the second embodiment that comprises a semiconductor wafer 201, a multiplication layer 202 covering the entire surface of the semiconductor wafer with the same conductivity type as the multiplication layer, a circular groove 203, which is filled with a dielectric material, a dielectric layer 204 covering the multiplication layer 202 surface, a contact layer 206, which is made through diffusion from the highly-doped polycrystalline silicon 205 with the opposite conductivity to that of the multiplication layer, wherein at least one avalanche amplifier 207 and photoconverter 208, which is outside the avalanche amplifier, are formed, an additional closed groove 211 with the width of 1.5 µm to 2.0 µm and the depth, which is more than or equal to the multiplication layer thickness, but less than the total thickness of the wafer and multiplication layer combined, and which is filled with highly doped polycrystalline silicon of the same conductivity type as the multiplication layer and encircles avalanche amplifiers 207 and photoconverter 208, a high-resistance layer 212, which is formed on the contact layer 206 within the avalanche amplifier 207 region, a transparent electrode 209, which is formed on the high-resistance layer 212 and dielectric layer 204 surfaces, and a second electrode 210, which is formed on the bottom surface of the semiconductor wafer 201.

DETAILED DESCRIPTION OF PREFERRED EMBODIMENTS

Reference will now be made in detail to the preferred embodiments of the present invention, examples of which are illustrated in the accompanying drawings.

The reference markings used across the present disclosure and accompanying drawings, except number 100 (incident light), consist of three digits, wherein the first digit is the figure number and the last two digits mark a specific element of the design.

For example, marking 206 points at the element number 06 (see the list below) in FIG. 2.

The following markings are used to point at specific elements of the design:

01—wafer,
02—multiplication layer,
03—circular groove,

04—dielectric layer,
05—highly-doped polycrystalline silicon layer,
06—contact layer,
07—avalanche amplifier,
08—photoconverter,
09—first electrode,
10—second electrode,
11—additional closed groove,
12—high-resistance layer.

Figure 1:
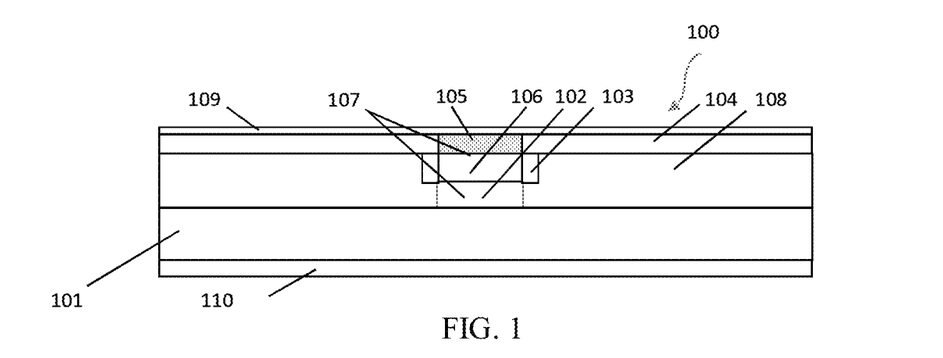
FIG. 1A shows the process of putting the multiplication layer 102 onto the silicon wafer 101.
FIG. 1B shows the process of forming the dielectric-filled circular groove 103.
FIG. 1C shows the process of putting the dielectric layer 104 onto the surface of the multiplication layer 102, wherein a window is created in said dielectric layer, which is filled with highly-doped polycrystalline silicon 105 with the opposite conductivity to that of the multiplication layer.
FIG. 1D shows the process of forming the avalanche amplifier 107 regions by creating a contact layer 106 through diffusion from the highly-doped polycrystalline silicon 105 filling the window in the dielectric layer 104 on top of the multiplication layer, wherein at least one avalanche amplifier 107 and photoconverter 108, which is outside the avalanche amplifier, are formed.
FIG. 1E shows the process of forming the first electrode 109 made of a transparent conductive material on the surfaces of the contact layer 107 and the dielectric layer 104.
FIG. 1F shows the process of forming the second electrode 110 on the semiconductor wafer 101.
Figure 1A:
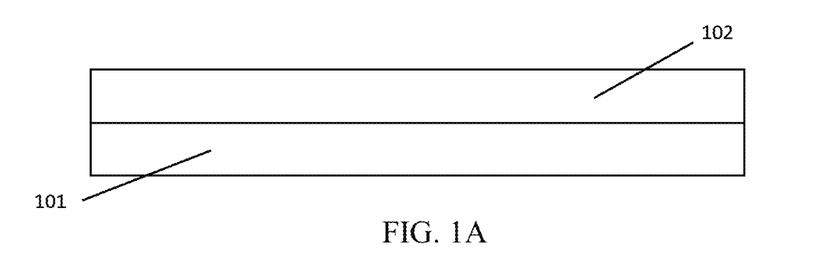
Figure 1B:
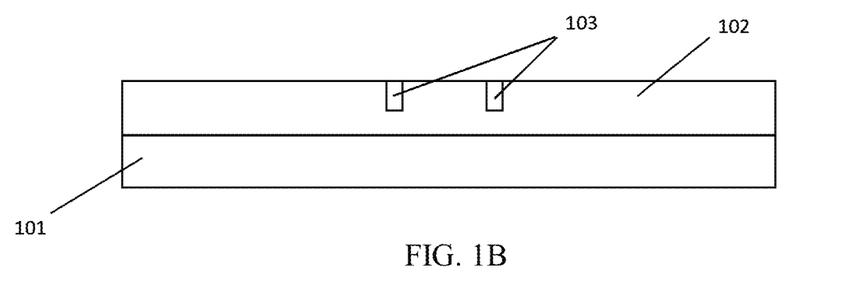
Figure 1C:
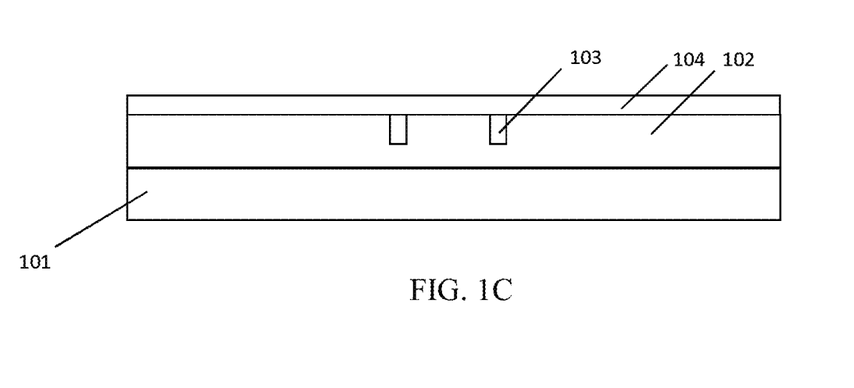
Figure 1D:
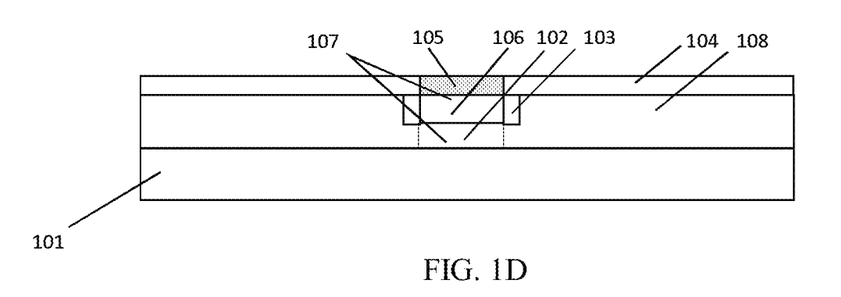
Figure 1E:
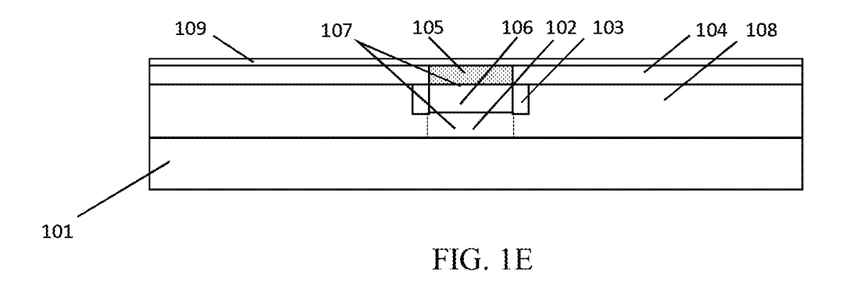
Figure 1F:
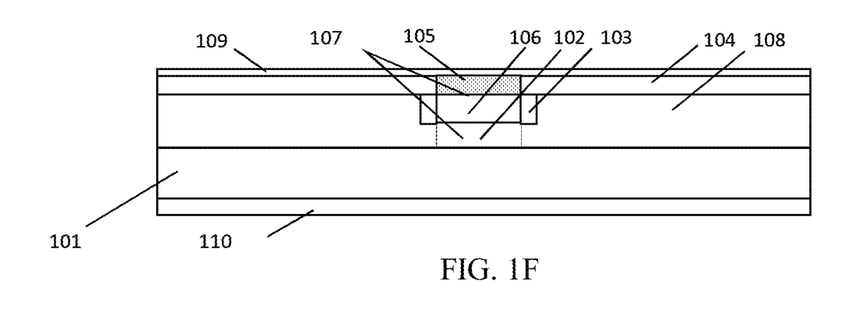

FIG. 1 shows a schematic transversal section of the claimed APD according to the first embodiment that comprises a semiconductor wafer 101, a multiplication layer 102 covering the entire surface of the semiconductor wafer with the same conductivity type as the multiplication layer, a circular groove 103, which is filled with a dielectric material, a dielectric layer 104 covering the multiplication layer 102 surface, a contact layer 106, which is made through diffusion of the highly-doped polycrystalline silicon layer 105 with the opposite conductivity to that of the multiplication layer, wherein at least one avalanche amplifier 107 and photoconverter 108, which is outside the avalanche amplifier, are formed, a first electrode 109 made of a transparent material and located on the surfaces of both the contact layer 106 and the dielectric layer 104, and a second electrode 110, which is formed on the bottom surface of the semiconductor wafer 101.

The method for manufacturing the APD as shown in FIG. 1 is further illustrated by FIGS. 1A, 1B, 1C, 1D, 1E, 1F and includes the following sequence of steps:
  Putting, onto the silicon wafer 101, a multiplication layer 102 of the same conductivity type as the wafer (see FIG. 1A);
  Forming, on the multiplication layer 102 surface, at least one circular groove 103, which is then filled by a dielectric material (see FIG. 1B);
  Forming on the multiplication layer 102 surface, a dielectric layer 104 (see FIG. 1C);
  Creating, within the region of the dielectric layer 104 that is bounded by the circular groove 103, a window, which is then filled by highly-doped polycrystalline silicon 105 with the opposite conductivity to that of the multiplication layer; then, forming, in the multiplication layer, one or more avalanche multiplier 107 regions by means of creating a contact layer 106 through diffusion from highly-doped polycrystalline silicon 105 that fills the dielectric layer 104 window, thus forming at least one avalanche multiplier 107 and photoconverter 108, which is located outside the avalanche multiplier (see FIG. 1D);
  Forming, on top of both the contact layer 106 and dielectric layer 104, a first electrode 109, which is made of a transparent conductive material (see FIG. 1E);
  Forming, on the semiconductor wafer 101, a second electrode 110 (see FIG. 1F).

An exemplary APD according to FIG. 1 can be manufactured using the method that involves the formation, by epitaxy, of multiplication layer 102, which has width of 5-7 µm and is made of p-type silicon with dopant concentration of $10^{15}$-$10^{17}$ cm$^{-3}$, on the silicon wafer 101 of the p+-type with dopant concentration higher than $10^{18}$ cm$^{-3}$. On top of the multiplication layer, a circular groove 103, which has the diameter of 1.0-2.0 µm, depth of 1.5-2.0 µm, and width of 0.4-0.5 µm, is formed using the methods of photolithography and plasma etching, and then filled by a dielectric material. A dielectric layer 104, with thickness of approximately 1.0-1.5 µm, is formed on the multiplication layer 102 surface using the method of thermochemical deposition, and in this layer 104, where the circular groove 103 is situated, a window is created using the methods of photolithography and plasma etching, which is then filled with highly-doped polycrystalline silicon 105 with the opposite conductivity to that of the multiplication layer and dopant concentration of at least $10^{19}$ cm$^{-3}$, using the method of thermochemical deposition. In the multiplication layer, one or more avalanche amplifier 107 regions are formed by creating a contact layer 106 through diffusion of the dopant from highly-doped polycrystalline silicon 105 with the penetration depth that is less that the depth of the circular groove 103.

At the same time, a photoconverter layer 108 is formed outside the avalanche amplifier. The first electrode 109, which is made of a transparent material of ITO or AZO type, is formed on top of both the contact layer 106 and dielectric layer 104, while the second electrode 110, which is an aluminum film with thickness of approximately 0.5-1.0 µm, is formed on the bottom surface of the semiconductor wafer 101.

The APD as shown in FIG. 1 operates as follows:
Positive voltage is applied to the electrode 109 relative to the electrode 110, enough to trigger impact ionization in the multiplication layer 102 of the avalanche amplifier 107 causing free charge carriers to multiply.

Incident light 100 falling upon the photoconverter 108 surface is absorbed, generating free charge carriers, i.e., electrons and electron holes. Free electrons that have been induced by light in the photoconverter 108 (photoelectrons) drift towards the avalanche multiplication layer 102, driven by superposition of electric fields, one of which seeps from the avalanche amplifier 107 and the other is induced by the first electrode 109 in the photoconverter, to be multiplied there, generating the APD's output signal, while the holes make their way into the wafer 101. Photoelectrons that have been induced by light in the non-depleted area of the photoconverter 104 are gathered in the depletion area of the photoconverter by means of diffusion caused by free electron concentration gradient in the photoconverter.

Figure 2:
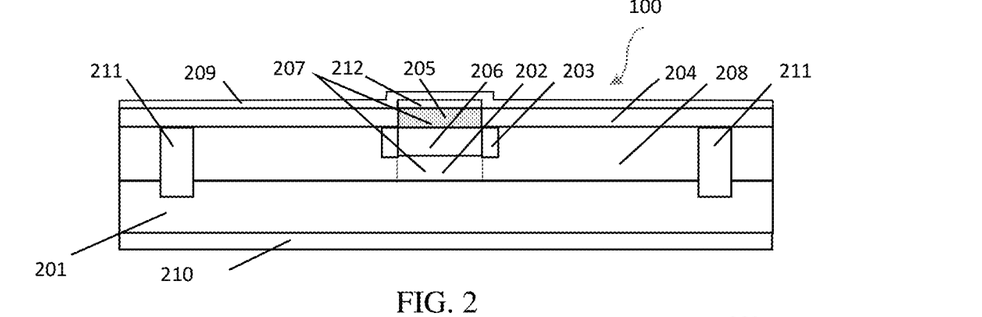
FIG. 2A shows the process of putting the multiplication layer 202 onto the silicon wafer 201.
FIG. 2B shows the process of forming an additional closed groove 211, which is then filled with highly-doped polycrystalline silicon of the same conductivity type as the multiplication layer, so that the photodetector can be formed inside said groove.
FIG. 2C shows the process of forming a circular groove 203, filled with a dielectric material, in the area of the proposed location of the avalanche amplifier 207.
FIG. 2D shows the process of putting the dielectric layer 204 onto the surface of the multiplication layer 202, wherein a window is created in said dielectric layer, which is filled with highly doped polycrystalline silicon 205 with the opposite conductivity to that of the multiplication layer.
FIG. 2E shows the process of forming the avalanche amplifier 207 regions by creating a contact layer 206 through diffusion of the highly-doped polycrystalline silicon 205 filling the window in the dielectric layer 204 on top of the multiplication layer, wherein at least one avalanche amplifier 207 and photoconverter 208, which is outside the avalanche amplifier, are formed.
FIG. 2F shows the process of forming a high-resistance layer 212 on the contact layer 206 within the avalanche amplifier 207 region.
FIG. 2G shows the process of forming the first electrode 209 made of a transparent conductive material on the surfaces of the contact layer 206 and the dielectric layer 204.
FIG. 2H shows the process of forming the second electrode 210 on the semiconductor wafer 201.

FIG. 2 shows a schematic transverse section of an APD according to the second embodiment that includes a semiconductor wafer 201, a multiplication layer 202 covering the entire surface of the semiconductor wafer with the same conductivity type as the multiplication layer, a circular groove 203, which is filled with a dielectric material, a dielectric layer 204 covering the multiplication layer 202 surface, a contact layer 206, which is made through diffusion of the highly-doped polycrystalline silicon 205 with the opposite conductivity to that of the multiplication layer, wherein at least one avalanche amplifier 207 and photoconverter 208, which is outside the avalanche amplifier, are formed, an additional closed groove 211 with the width of 1.5 µm to 2.0 µm and the depth, which more than or equal to the multiplication layer thickness, but less than the total thickness of the wafer and multiplication layer combined, and which is filled with highly-doped polycrystalline silicon of the same conductivity type as the multiplication layer, wherein inside the region bounded by the groove, avalanche amplifiers 207 and the photoconverter 208 are located, a high-resistance layer 212, which is formed on the contact layer 206 within the avalanche amplifier 207 region, a transparent electrode 209, which is formed on the surfaces of the highly-doped polycrystalline silicon 205, high-resistance layer 212, and dielectric layer 204, and a second electrode 210, which is formed on the bottom surface of the semiconductor wafer 201.

Figure 2A:
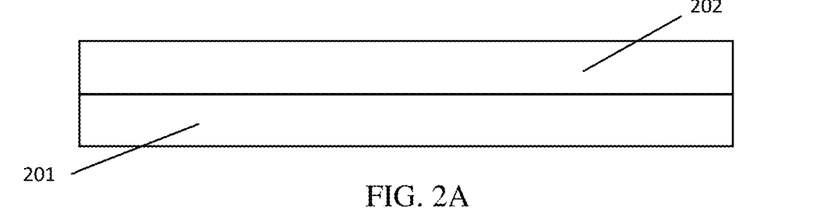
Figure 2B:
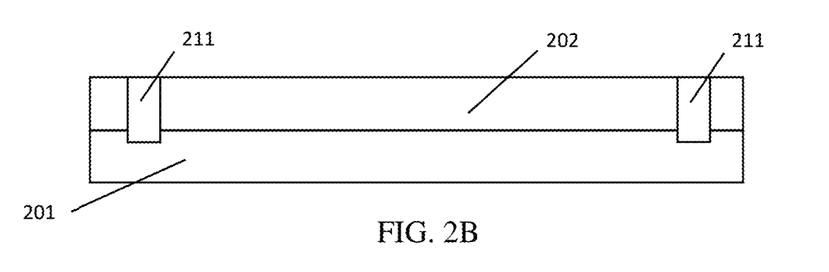
Figure 2C:
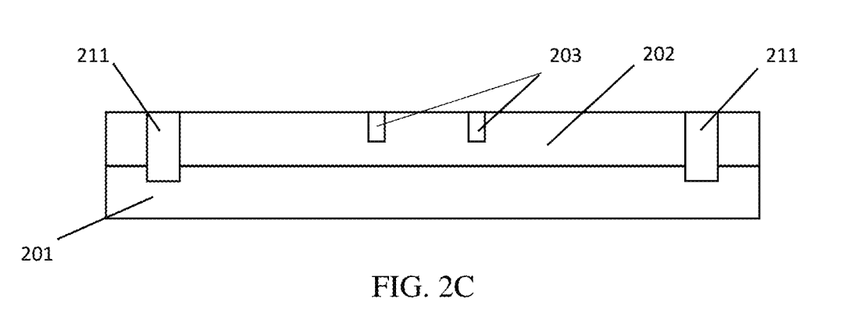
Figure 2D:
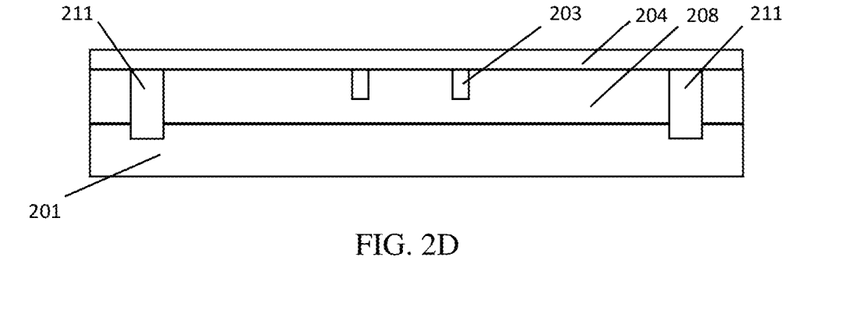
Figure 2E:
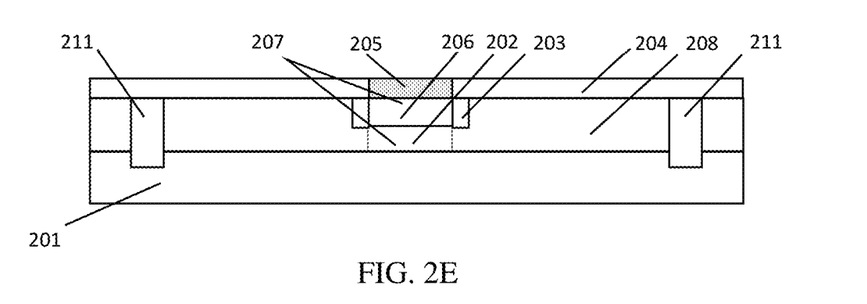
Figure 2F:
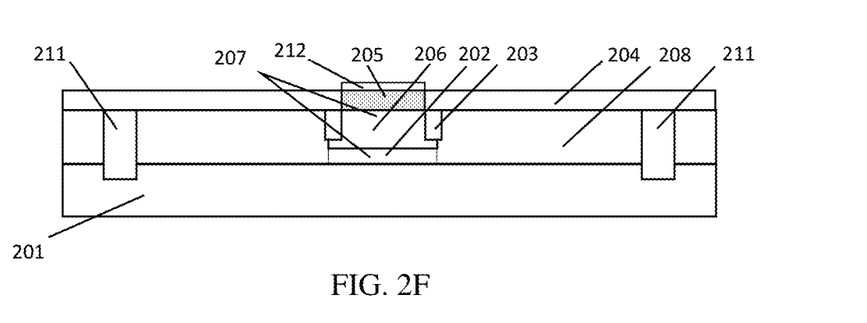
Figure 2G:
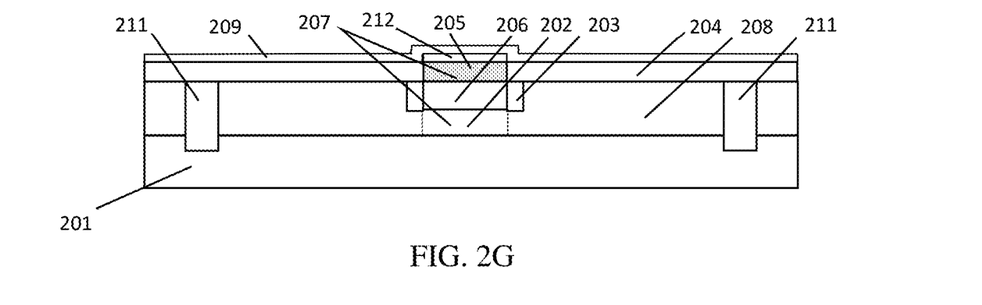
Figure 2H:
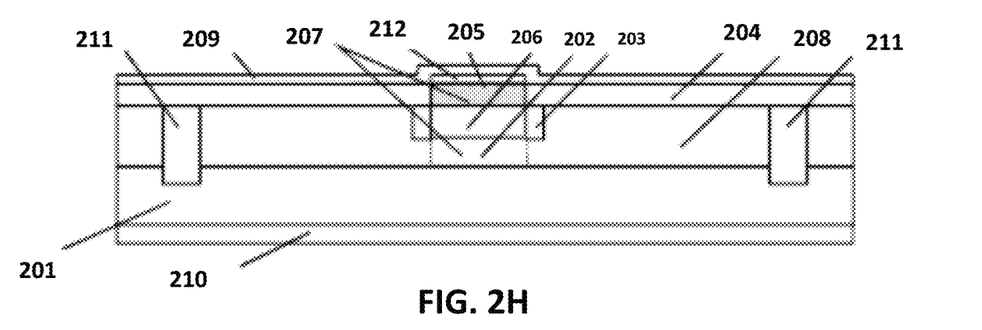
Figure 3A:
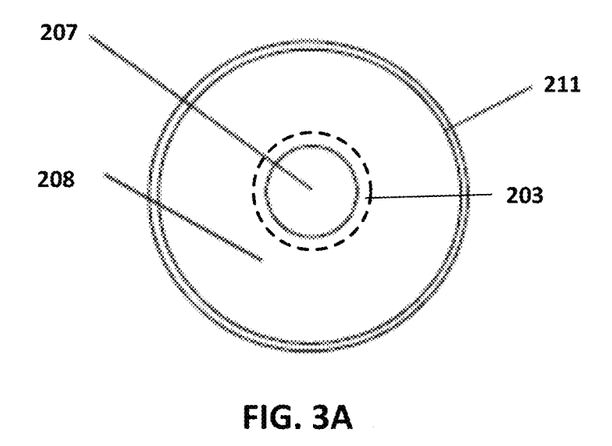
FIG. 3A is a schematic top view of the APD according to the second embodiment that comprises a single avalanche amplifier 207 and a groove 211.
Figure 3B:
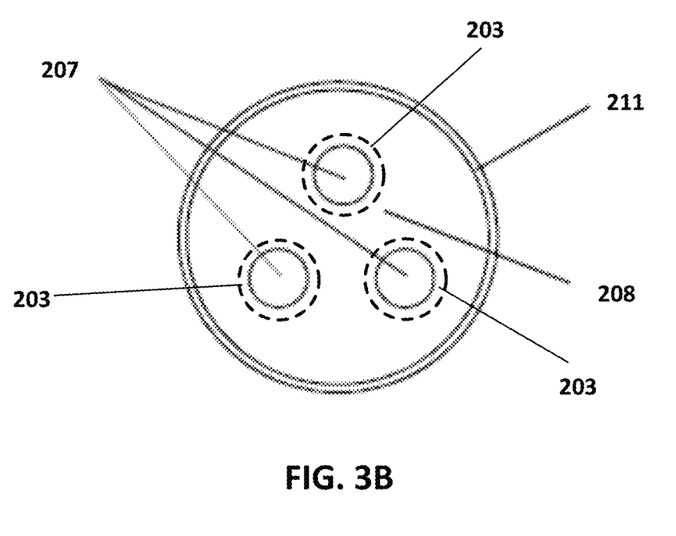
FIG. 3B is a schematic top view of the APD according to the second embodiment that comprises three avalanche amplifiers 207 and a groove 211.

The method for manufacturing the APD as shown in FIG. 2 is further illustrated by FIGS. 2A, 2B, 2C, 2D, 2E, 2F, 2G, 2H and includes the following sequence of steps:

Putting, onto the silicon wafer 201, a multiplication layer 202 of the same conductivity type as the wafer (see FIG. 2A);

Etching, in the multiplication layer 202 and the wafer 201, an additional closed groove 211, which is then filled with highly-doped polycrystalline silicon of the same conductivity type as the multiplication layer, in order to form a photodetector inside the region bounded by the groove (see FIG. 2B);

Forming, upon the multiplication layer surface, where the avalanche amplifier 207 is situated, at least one circular groove 203, which is then filled with a dielectric material (see FIG. 2C);

Putting, onto the multiplication layer 202 surface, a dielectric layer 204 (see FIG. 2D);

Creating, in the dielectric layer 204, above the multiplication layer and within the bounds of the circular groove 203, a window, which is then filled by highly-doped polycrystalline silicon 205 with the opposite conductivity to that of the multiplication layer, and forming, in the multiplication layer 202, at least one avalanche amplifier 207 region by creating a contact layer 206 through diffusion of the dopant from highly-doped polycrystalline silicon 205, so that at least one avalanche amplifier 207 and a photoconverter 208, which is outside the avalanche amplifier, are formed (see FIG. 2E);

Putting a high-resistance layer 212 onto highly-doped polycrystalline silicon 205 (see FIG. 2F);

Forming, on top of the high-resistance layer 212 and dielectric layer 204, a first electrode 209 made of a transparent conductive material (see FIG. 2G);

Forming, on the bottom surface of the semiconductor wafer 201, a second electrode 210 (see FIG. 2H).

An exemplary APD according to FIG. 2 can be manufactured using the method that involves splicing the multiplication layer 202, which has width of 5-7 µm and is made of p-type silicon with dopant concentration of $10^{15}$-$10^{17}$ cm$^{-3}$, by epitaxy, onto the silicon wafer 201 of the p+-type with dopant concentration higher than $10^{18}$ cm$^{-3}$. Then, an additional closed groove 211 with the width of 1.5 µm to 2.0 µm and the depth, which more than or equal to the multiplication layer thickness, but less than the total thickness of the wafer and multiplication layer combined, is etched on the multiplication layer 202 surface and filled with highly-doped polycrystalline silicon of the same conductivity type as the multiplication layer 202, so that a photodetector can be formed inside the region bounded by said groove. On top of the multiplication layer, a circular groove 203, which has the diameter of 1.0-2.0 µm, depth of 1.5-2.0 µm, and width of 0.4-0.5 µm, is formed using the methods of photolithography and plasma etching, and then filled by a dielectric material.

A dielectric layer 204, with thickness of approximately 1.0-1.5 µm, is put onto the multiplication layer 202 surface using the method of thermochemical deposition, and in this layer 204, where the circular groove 203 is situated, a window is created using the methods of photolithography and plasma etching, which is then filled with highly-doped polycrystalline silicon 205 with the opposite conductivity to that of the multiplication layer and dopant concentration of at least $10^{19}$ cm$^{-3}$, using the method of thermochemical deposition. In the multiplication layer, one or more avalanche amplifier 207 regions are formed by creating a contact layer 206 through diffusion of dopant from highly-doped polycrystalline silicon 205 with the penetration depth that is less that the depth of the circular groove 203. At the same time, a photoconverter layer 208 is formed outside the avalanche amplifier.

A high-resistance layer 212 made of high-resistance polycrystalline silicon is formed on highly-doped polycrystalline silicon 205. The first electrode 209, which is made of a transparent conductive material of ITO or AZO type, is formed on top of both the high-resistance layer 212 that is made of high-resistance polycrystalline silicon (e.g., at least 1 megaohm/µm$^2$ at layer thickness 100 nm) and dielectric layer 204, while the second electrode 210, which is an aluminum foil with thickness of approximately 0.5-1.0 µm, is formed on the bottom surface of the semiconductor wafer 201.

The APD according to the second embodiment as shown in FIG. 2, i.e., having a groove that runs along the multiplication layer edges, is characterized in that it allows to suppress the inflow of parasite charge carriers—both dark and light—which get into the avalanche amplifier from neighboring regions. In order to effectively suppress such parasite currents, the groove, whose depth is more than the multiplication layer thickness, but less than the total thickness of the wafer and multiplication layer combined, is to be filled with highly-doped polycrystalline silicon of the same conductivity type as the multiplication layer. The high-resistance layer 212 provides negative feedback when the avalanche is formed, thus allowing to achieve higher multiplication coefficients, particularly, when operating in the so-called "Geiger" mode.

Otherwise, this APD embodiment functions similarly to that illustrated by FIG. 1.

Having thus described a preferred embodiment, it should be apparent to those skilled in the art that certain advantages of the described method and apparatus have been achieved.

It should also be appreciated that various modifications, adaptations, and alternative embodiments thereof may be made within the scope and spirit of the present invention. The invention is further defined by the following claims.

What is claimed is:

1. A method of manufacturing an avalanche photodetector, the method comprising:

forming a multiplication layer on an entire top surface of a semiconductor wafer, etching a closed groove on a top surface of the multiplication layer, so that a depth of the closed groove is greater than or equal to a thickness of the multiplication layer, but is smaller than a total thickness of the semiconductor wafer and the multiplication layer combined;

filling the closed groove with highly-doped polycrystalline silicon of the same conductivity type as the multiplication layer;

forming a photodetector inside a region bounded by the closed groove, the photodetector comprising an avalanche amplifier and a photoconverter;

forming at least one avalanche amplifier in the top surface of the multiplication layer in an area bounded by the closed groove, by (i) etching a circular groove inside a region of the multiplication layer bounded by the closed groove, wherein the circular groove defines the avalanche amplifier, and wherein a depth of the circular groove is less than a thickness of the multiplication layer;

(ii) filling the circular groove with a dielectric material;

(iii) putting a dielectric layer onto surfaces of the multiplication layer and the circular groove;
(iv) filling a window in the dielectric layer with highly doped polycrystalline silicon having an opposite conductivity of the multiplication layer;
(v) placing a contact layer of the avalanche amplifier inside a region bounded by the circular groove, so that the photoconverter is outside the region bounded by the circular groove, such that the photoconverter and the avalanche amplifier are laterally adjacent to each other;
forming a high-resistance layer on the contact layer of the avalanche amplifier;
forming a first electrode made of a transparent material over the high-resistance layer and the dielectric layer;
forming a second electrode on a bottom surface of the semiconductor wafer; and
wherein the high-resistance layer has a resistance of at least 1 megaohm/$\mu m^2$ at a layer thickness 100 nm.

2. The method of claim 1, wherein the semiconductor wafer is made of a low-resistance material with a dopant concentration of at least $10^{19}$ cm$^{-3}$.

3. The method of claim 1, wherein the multiplication layer is formed using an epitaxy method.

4. The method of claim 1, wherein both the semiconductor wafer and the multiplication layer are made of the same semiconductor material.

5. The method of claim 1, wherein the contact layer is made by doping the multiplication layer with a dopant that forms a layer with an opposite conductivity.

6. The method of claim 1, wherein the closed groove has a width of 1.5 µm to 2.0 µm.

7. The method of claim 5, wherein the contact layer is formed by doping the multiplication layer with a dopant concentration of at least $10^{19}$ cm$^{-3}$.

8. The method of claim 1, wherein the closed groove has a width of 1.5 µm to 2.0 µm.

9. The method of claim 5, wherein the contact layer is formed through diffusion of a dopant from the highly-doped polycrystalline silicon that is inside the circular groove.

10. A method of manufacturing an avalanche photodetector, the method comprising:
forming a multiplication layer on a semiconductor wafer,
etching a closed groove on a top surface of the multiplication layer, so that a depth of the closed groove is smaller than a total thickness of the semiconductor wafer and the multiplication layer combined; filling the closed groove with highly-doped polycrystalline silicon of the same conductivity type as the multiplication layer;
forming at least one avalanche amplifier in the top surface of the multiplication layer in an area bounded by the closed groove, by
(i) etching a circular groove inside a region of the multiplication layer bounded by the closed groove, wherein the circular groove defines the avalanche amplifier, and wherein a depth of the circular groove is less than a thickness of the multiplication layer;
(ii) filling the circular groove with a dielectric material;
(iii) putting a dielectric layer onto surfaces of the multiplication layer and the circular groove;
(iv) creating a window in the dielectric layer inside the circular groove;
(v) filling the window with highly doped polycrystalline silicon having an opposite conductivity of the multiplication layer;
(vi) forming a contact layer of an avalanche amplifier through diffusion of the highly-doped polycrystalline silicon into the multiplication layer inside a region bounded by the circular groove, so as to form a photoconverter layer outside the region bounded by the circular groove and inside the closed groove;
forming a high-resistance layer on the contact layer of the avalanche amplifier;
forming a first electrode made of a transparent material over the high-resistance layer and the dielectric layer; and
forming a second electrode on a bottom surface of the semiconductor wafer; and
wherein the high-resistance layer has a resistance of at least 1 megaohm/$\mu m^2$ at a layer thickness 100 nm.

11. The method of claim 10, wherein the semiconductor wafer is made of a low-resistance material with a dopant concentration of at least $10^{19}$ cm$^{-3}$.

12. The method of claim 10, wherein the multiplication layer is formed using epitaxy.

13. The method of claim 10, wherein both the semiconductor wafer and the multiplication layer are made of the same semiconductor material.

14. The method of claim 10, wherein the contact layer is formed by doping the multiplication layer with a dopant concentration of at least $10^{19}$ cm$^{-3}$.

15. The method of claim 10, wherein the closed groove has a width of 1.5 µm to 2.0 µm.

\* \* \* \* \*